United States Patent [19]
Itoku

[11] Patent Number: 5,969,656
[45] Date of Patent: Oct. 19, 1999

[54] DIGITAL-TO-ANALOG CONVERTER FOR INCREASING NUMBER OF BITS CONVERTED

[75] Inventor: Osamu Itoku, Tokyo, Japan

[73] Assignee: NEC Corporation, Tokyo, Japan

[21] Appl. No.: 08/908,057

[22] Filed: Aug. 11, 1997

[30] Foreign Application Priority Data

Sep. 6, 1996 [JP] Japan .................................. 8-236515

[51] Int. Cl.⁶ .................................................. H03M 1/00
[52] U.S. Cl. .......................................... 341/144; 341/145
[58] Field of Search ................................... 341/144, 145

[56] References Cited

U.S. PATENT DOCUMENTS

| | | | |
|---|---|---|---|
| 4,006,475 | 2/1977 | Candy et al. | 341/145 |
| 5,101,204 | 3/1992 | Matsusako | 341/145 |
| 5,210,711 | 5/1993 | Rossmere et al. | 364/786 |
| 5,321,642 | 6/1994 | Goldberg | 364/721 |

*Primary Examiner*—Brian Young
*Assistant Examiner*—Peguy JeanPierre
*Attorney, Agent, or Firm*—Foley & Lardner

[57] ABSTRACT

The present invention is a digital-to-analog converter comprising: a core digital-to-analog converter which converts digital signal of first number of bits to analog signal, a generator of an addend whose duty corresponds to the digital signal of second number of bits, an adder which adds the addend as least significant bit to the digital signal of first number of bits and supplies its output to the core digital-to-analog converter, and a filter which is supplied with its input from the core digital-to-analog converter and eliminates the ripples of the input to provide a ripple-eliminated analog signal at its output terminal, whereby the digital-to-analog converter can converts a digital signal of number of bits which exceed the first number, more exactly is the sum of the first number and the second number, to an analog signal.

6 Claims, 2 Drawing Sheets

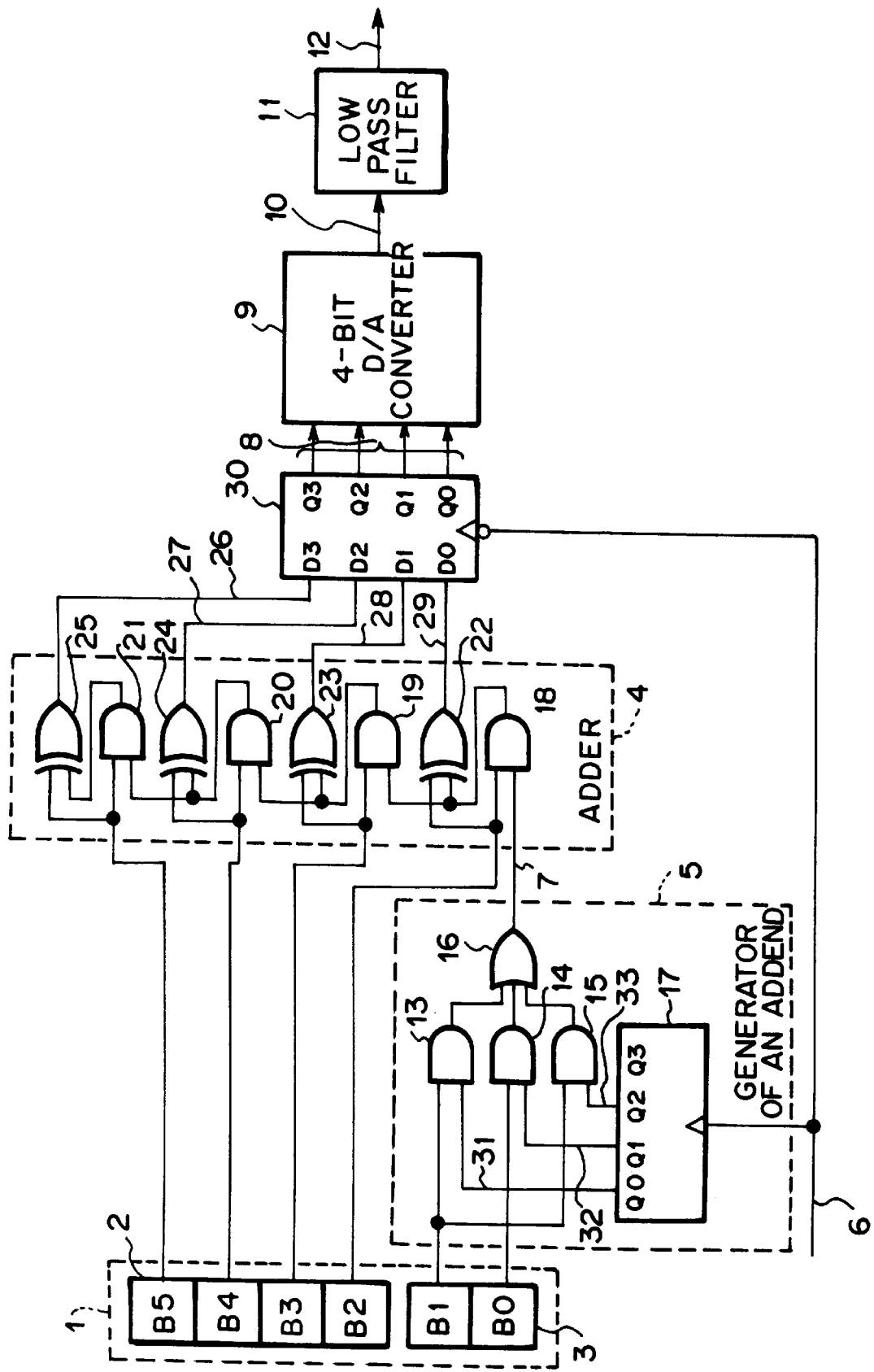

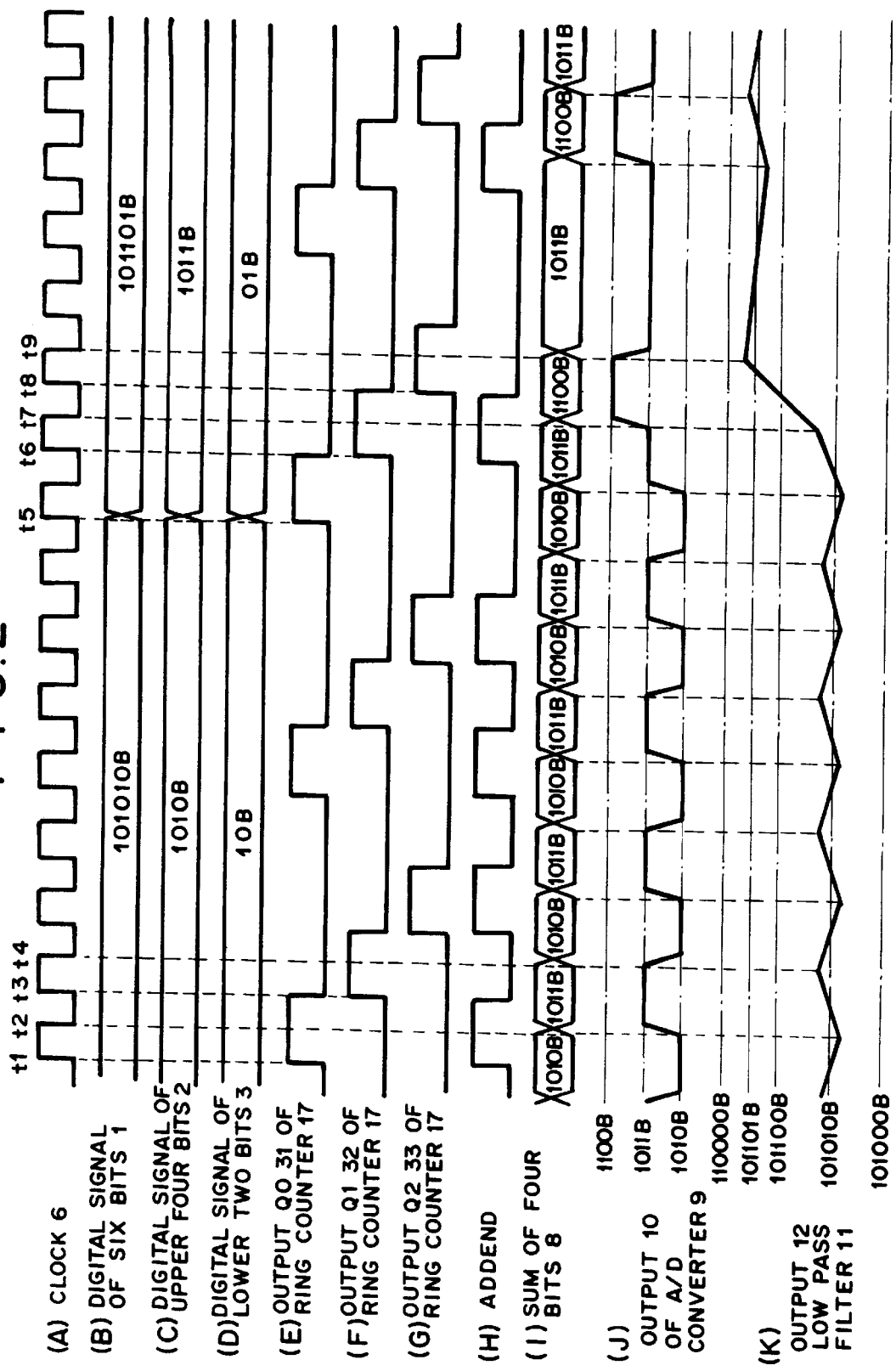

5,969,656

DIGITAL-TO-ANALOG CONVERTER FOR INCREASING NUMBER OF BITS CONVERTED

BACKGROUND OF THE INVENTION

1. Field of the Invention

This invention relates to a digital-to-analog converter and, more specifically, to a digital-to-analog converter which can deal with digital signal whose number of bits exceeds the number of bits which analog-to-digital converter module used as its core can treat.

2. The Prior Art

Although digital signals, instead of analog signals, are mainly processed in the information processing electronics nowadays, analog signals are still used at interfaces between equipments. Therefore, digital-to-analog converters are necessary to convert digital signals in equipments to analog signals to provide them at their interfaces.

Usually a digital-to-analog converter converts digital signal of predefined number of bits to analog signal. The number of bits is specified for each device and it cannot treat the number of bits that exceeds the predefined number.

As the resolution of a digital-to-analog converter equipped in a certain electronics is fixed, it must be replaced to that of higher resolution if higher resolution is required.

But it is not easy to replace a digital-to-analog converter to another one once it has been equipped, and the price of analog-to-converter with high-resolution is expensive. That is, it is difficult for manufacturers and users to improve the resolution of digital-to-analog converter that is already equipped in electronics and, therefore, the versatility and the applicability of the electronics become poor.

SUMMARY OF THE INVENTION

Therefore, it is an object of the present invention to provide a digital-to analog converter which can deal with digital signal whose number of bits exceeds the number of bits which analog-to-digital converter module used as its core can treat.

According to an aspect of the present invention, there is provided a digital-to-analog converter comprising: a core digital-to-analog converter which converts digital signal of first number of bits to analog signal, a generator of an addend whose duty corresponds to the digital signal of second number of bits, an adder which adds the addend as least significant bit to the digital signal of first number of bits and supplies its output to the core digital-to-analog converter, and a filter which is supplied with its input from the core digital-to-analog converter and eliminates the ripples of the input to provide a ripple-eliminated analog signal at its output terminal, whereby the digital-to-analog converter can convert a digital signal of number of bits which exceed the first number, more exactly is the sum of the first number and the second number, to an analog signal.

These and other object, features and advantages of the present invention will become more apparent in light of the following detailed description of the best mode of embodiments, as illustrated in the accompanying drawings.

BRIEF DESCRIPTION OF DRAWINGS

FIG. 1 is a block diagram of the digital-to-analog converter according to one embodiment of present invention.

FIG. 2 is a timing chart showing the waveforms appearing at each points of the digital-to-analog converter shown in FIG. 1.

DESCRIPTION OF PREFERRED EMBODIMENTS

An embodiment of the present invention is described in detail below with reference to the drawings. A digital-to-analog converter according to this embodiment is a six-bit one comprising a four-bit digital-to-analog converter used as its core.

FIG. 1 shows a digital-to-analog converter in accordance with an embodiment of the present invention. An addend generator 5 comprises AND gates 13, 14, and 15, OR gate 16, and a ring counter 17. Clock 6 is supplied to the ring counter 17 and its output signals Q0, Q1, Q2, and Q3 alternately become "1"(HIGH) in their order in a four clock cycle.

An input six-bit digital signal 1 is divided into two parts: an upper four-bit signal 2 and a lower two-bit signal 3. Bit 1(second LSB) in the lower signal 3 is ANDed with outputs Q0 31 and Q2 33 of the ring counter 17 in AND gates 13, and 15, respectively, and bit 0(LSB) in the lower signal 3 is ANDed with outputs Q1 32 of the ring counter in AND gate 14. These ANDed signals are ORed in OR gate 16 to produce ORed signal 7.

The output of OR gate 16 is added to the upper four-bit signal as least significant bit in an adder 4.

The adder 4 comprises four half-adders connected together in ladder, or it comprises AND gates 18, 19, 20, and 21, and exclusive OR gates 22, 23, 24, and 25.

The four-bit output of the adder 4 is latched in a four-bit D-type flip-flop 30. The latched output of the four-bit D-type flip-flop is supplied to a four-bit digital-to-analog converter 9.

Because the input of the four-bit D-type flip-flop is delayed in the addend generator 5 and the adder 4, inverted clock is supplied to the four-bit D-type flip-flop 30 to maintain timing margin between the inputs and the clock of it.

Because the output 10 of the four-bit digital-to-analog converter 9 changes in synchronism with a clock, the output is averaged in a low pass filter 11 to generate an objective analog output signal 12.

The timing chart in FIG. 2 shows waveforms and value of signals at each points of circuit shown in FIG. 1. In this chart, the input six-bit digital signal is "101010B" at the first, and then it changes to "101101B" at time t5.

At the beginning, the upper four-bit signal 2 is "1010B", bit 1(second LSB) of the lower two-bit signal 3 is "1", and bit 0(LSB) of the lower two-bit signal is "0" as the input six-bit signal is "101010B".

At time t1, because only Q0 31 among the outputs Q0 through Q3 of the ring counter 17 supplied to one input terminal of AND gate 13 is "1"(HIGH) and the bit 1 supplied to the other input terminal of AND gate 13 is "1", only output of AND gate 13 is "1" among AND gates 13 through 15 and the output 7 of the addend generator becomes "1". At the same time, the adder 4 adds "1", the value of the addend 7, to "1010B", the value of the four-bit upper signal, to get the output signal "1011B". At time t2, the D-type flip-flop latches the signal "1011B" and the digital-to-analog converter 9 converts the digital signal "1011B" to its corresponding analog output voltage.

At time t3, because only Q1 32 among the outputs Q0 through Q3 of the ring counter 17 supplied to one input terminal of AND gate 14 is "1"(HIGH) and the bit 0 supplied to the other input terminal of AND gate 14 is "0", the outputs of all of AND gates 13 through 15 are "0" and the output 7 of the addend generator becomes "0". At the same time, the value of the output signal of the adder 4 becomes equal to the value of the four-bit upper digital signal 2, i.e. "1010B". At time t4, the D-type flip-flop latches the signal "1010B" and the digital-to-analog converter 9 converts the digital signal "1010B" to its corresponding analog output voltage.

In the same manner, the output value at line 8 becomes "1011B" at next negative edge of the clock, and the output value at line 8 becomes "1010B" at second next negative edge of the clock.

The operation in the same manner as described with two cycles of four clocks are repeatedly continued until time t5. As shown in FIG. 2, the period between t1 and t5 corresponds to eight clock cycles or two cycles of the ring counter 17.

During the period between t1 and t5, because the voltage corresponding to the digital signal value "1011B" and the voltage corresponding to the digital signal value "1010B" appear at the output line 10 in time proportion of one to one and they are averaged in the low pass filter 11, the voltage of the analog output signal 12 corresponds to a digital signal value "1010.10B".

The six-bit input digital signal changes to "101101B" at time t5.

At time t6, because only Q1 32 among the outputs Q0 through Q3 of the ring counter 17 supplied to one input terminal of AND gate 14 is "1"(HIGH) and the bit 0 supplied to the other input terminal of AND gate 14 is "1", only output of AND gate 14 is "1" among AND gates 13 through 15 and the output 7 of the addend generator becomes "1". At the same time, the adder 4 adds "1", the value of the addend 7, to "1011B", the value of the four-bit upper signal, to get output signal "1100B". At time t7, the D-type flip-flop latches the signal "1100B" and the digital-to-analog converter 9 converts the digital signal "1100B" to its corresponding analog output voltage.

At time t8, because only Q2 33 among the outputs Q0 through Q3 of the ring counter 17 supplied to one input terminal of AND gate 15 is "1"(HIGH) and the bit 1 supplied to the other input terminal of AND gate 15 is "0", the outputs of all of AND gates 13 through 15 are "0" and the output 7 of the addend generator becomes "0". At the same time, the value of output signal of the adder 4 becomes equal to the value of the four-bit upper digital signal 2, i.e. "1011B". At time t9, the D-type flip-flop latches the signal "1011B" and the digital-to-analog converter 9 converts the digital signal "1011B" to its corresponding analog output voltage.

The operation in the same manner as described with two cycles of four clocks are repeatedly continued.

Beginning time t5, because the voltage corresponding to the digital signal value "1100B" and the voltage corresponding to the digital signal value "1011B" appear at the output line 10 in time proportion of three to one and they are averaged in the low pass filter 11, the voltage of the analog output 12 corresponds to a digital signal value "1011.01B".

As described before, in case that the value of the lower two-bit is "10B", the voltage corresponding to the value of the upper four-bit digital signal and the voltage corresponding to the incremented value of the upper four-bit digital signal appear at the output line 10 in time proportion of one and one.

Similarly, in case that the value of the lower two-bit is "01B", the voltage corresponding to the value of the upper four-bit digital signal and the voltage corresponding to the incremented value of the upper four-bit digital signal appear at the output line 10 in time proportion of three and one.

Moreover similarly, in case that the value of the lower two-bit is "11B", the voltage corresponding to the value of the upper four-bit digital signal and the voltage corresponding to the incremented value of the upper four-bit digital signal appear at the output line 10 in time proportion of one and three.

Finally, in case that the value of the lower two-bit is "00B", only the voltage corresponding to the value of the upper four-bit digital signal appears at the output line 10.

To summarize, the value of the output line 10 of the digital-to-analog converter 9 corresponds to one of the two values: the value of the upper four-bit digital signal and the incremented value of the upper four-bit digital signal, and the duty corresponding to the incremented value varies in accordance with the value of the two-bit lower digital signal with four steps, i.e. 0/4, 1/4, 2/4, or 3/4.

If the value of the upper four-bit digital signal is fixed, an average voltage of the analog output signal 12 of the low pass filter 11 varies in four steps in accordance with the value of the lower two-bit digital signal. That is, the resolution of the digital-to-digital converter is of six bits.

The characteristic of low pass filter must be chosen so as to eliminate only ripples of the output signal 10 of the four-bit digital-to-analog converter as shown in FIG. 2K. The cycle of the ring counter 17 must be a quotient of the input digital signal period divided by natural number to generate accurate output voltage.

Having described a specific preferred embodiment of the present invention with reference to the accompanying drawings, it is to be understood that the invention is not limited to that precise embodiment, and that various changes and modifications may be effected by one skilled in the art without departing from the scope or spirit of the invention as defined in the appended claims.

What is claimed is:

1. A digital-to-analog converter comprising:
   a core digital-to-analog converter which converts a digital signal of a first number of bits to an analog signal;
   a generator of an addend whose duty corresponds to a digital signal of a second number of bits, wherein the generator includes a ring counter whose outputs alternately become "1" in a time cycle, and wherein the ring counter outputs are combined with said digital signal of a second number of bits;
   an adder which adds said addend as least significant bit to said digital signal of a first number of bits and supplies its output to said core digital-to-analog converter; and
   a filter which is supplied with its input from said core digital-to-analog converter and eliminates the ripples of the input to provide a ripple-eliminated analog signal at its output terminal, whereby the digital-to-analog converter can convert a digital signal of a number of bits which exceed said first number to an analog signal.

2. A digital-to-analog converter according to claim 1, wherein
   said first number is four,
   said second number is two,
   said ring counter generates first through fourth outputs,
   said generator of an addend comprises:
     a first AND gate which ANDs the upper bit of said digital signal of a second number of bits with said first output;
     a second AND gate which ANDs the lower bit of said digital signal of a second number of bits with said second output;

a third AND gate which ANDs the upper bit of said digital signal of a second number of bits with said third output; and an OR gate which ORs all of the outputs of said first through third AND gates to provide its output as the output of said generator of an addend.

3. A digital-to-analog converter according to claim 2, wherein a cycle of said ring counter is a quotient of the input digital signal period divided by a natural number.

4. A digital-to-analog converter comprising:

a timer which counts a time cycle, wherein the timer is a ring counter whose outputs alternately become "1" in a time cycle;

a generator of an addend which is supplied with a digital signal of a first number of bits and generates a value "1" as an addend for the time period corresponding to the value of said digital signal of a first number of bits, and generates a value "0" as an addend for the rest of the time, and wherein the ring counter outputs are combined with said digital signal of a first number of bits;

an adder which adds said addend as least significant bit to a digital signal of a second number of bits and outputs the sum of them;

a core digital-to-analog converter which is supplied with said sum and converts it to a corresponding analog signal; and a filter which is supplied with said analog signal and eliminates the ripples of the input to provide a ripple-eliminated analog signal at its output terminal.

5. A digital-to-analog converter according to claim 4, wherein said first number is four, said timer generates first through fourth outputs, said generator of an addend comprises:

a first AND gate which ANDs the upper bit of said digital signal of a first number of bits with said first output;

a second AND gate which ANDs the lower bit of said digital signal of a first number of bits with said second output;

a third AND gate which ANDs the upper bit of said digital signal of a first number of bits with said third output; and an OR gate which ORs all of the outputs of said first through third AND gates to provide its output as the output of said generator of an addend.

6. A digital-to-analog converter according to claim 4, wherein a cycle of said time cycle is a quotient of the input digital signal period divided by a natural number.

* * * * *